United States Patent
Hung et al.

(10) Patent No.: US 11,437,420 B2
(45) Date of Patent: Sep. 6, 2022

(54) IMAGE SENSOR WITH OVERLAP OF BACKSIDE TRENCH ISOLATION STRUCTURE AND VERTICAL TRANSFER GATE

(71) Applicant: Taiwan Semiconductor Manufacturing Co., Ltd., Hsin-Chu (TW)

(72) Inventors: Feng-Chi Hung, Chu-Bei (TW); Dun-Nian Yaung, Taipei (TW); Jen-Cheng Liu, Hsin-Chu (TW); Wei Chuang Wu, Tainan (TW); Yen-Yu Chen, Kaohsiung (TW); Chih-Kuan Yu, Nantou County (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/733,433

(22) Filed: Jan. 3, 2020

(65) Prior Publication Data
US 2021/0210532 A1 Jul. 8, 2021

(51) Int. Cl.
*H01L 27/146* (2006.01)

(52) U.S. Cl.
CPC ...... *H01L 27/1463* (2013.01); *H01L 27/1461* (2013.01); *H01L 27/1464* (2013.01); *H01L 27/1469* (2013.01); *H01L 27/14614* (2013.01); *H01L 27/14621* (2013.01); *H01L 27/14627* (2013.01); *H01L 27/14634* (2013.01); *H01L 27/14636* (2013.01); *H01L 27/14645* (2013.01);
(Continued)

(58) Field of Classification Search
CPC .......... H01L 27/1463; H01L 27/14614; H01L 27/1464
See application file for complete search history.

(56) References Cited

U.S. PATENT DOCUMENTS 8,946,794 B2 * 2/2015 Ahn ................ H01L 27/14609
257/239
9,425,343 B2 8/2016 Lai et al.
(Continued)

FOREIGN PATENT DOCUMENTS

KR 20160017623 A 2/2016

*Primary Examiner* — David A Zarneke
(74) *Attorney, Agent, or Firm* — Eschweiler & Potashnik, LLC

(57) ABSTRACT

Some embodiments are directed towards an image sensor device. A photodetector is disposed in a semiconductor substrate, and a transfer transistor is disposed over photodetector. The transfer transistor includes a transfer gate having a lateral portion extending over a frontside of the semiconductor substrate and a vertical portion extending to a first depth below the frontside of the semiconductor substrate. A gate dielectric separates the lateral portion and the vertical portion from the semiconductor substrate. A backside trench isolation structure extends from a backside of the semiconductor substrate to a second depth below the frontside of the semiconductor substrate. The backside trench isolation structure laterally surrounds the photodetector, and the second depth is less than the first depth such that a lowermost portion of the vertical portion of the transfer transistor has a vertical overlap with an uppermost portion of the backside trench isolation structure.

20 Claims, 14 Drawing Sheets

(52) U.S. Cl.
CPC .. *H01L 27/14685* (2013.01); *H01L 27/14689* (2013.01)

(56) References Cited

U.S. PATENT DOCUMENTS

| | | | |
|---|---|---|---|
| 9,564,463 B2* | 2/2017 | Ihara | H01L 27/14685 |
| 9,609,250 B2* | 3/2017 | Lee | H01L 27/14603 |
| 9,812,482 B2 | 11/2017 | Kao et al. | |
| 10,566,380 B2* | 2/2020 | Jung | H01L 27/14641 |
| 10,790,322 B1* | 9/2020 | Wang | H01L 27/14689 |
| 2013/0175582 A1 | 7/2013 | Ihara et al. | |
| 2016/0027833 A1* | 1/2016 | Yamamoto | H01L 27/14687 438/57 |
| 2016/0086984 A1 | 3/2016 | Wang et al. | |
| 2016/0343751 A1 | 11/2016 | Sze et al. | |
| 2019/0371838 A1 | 12/2019 | Takahashi et al. | |

* cited by examiner

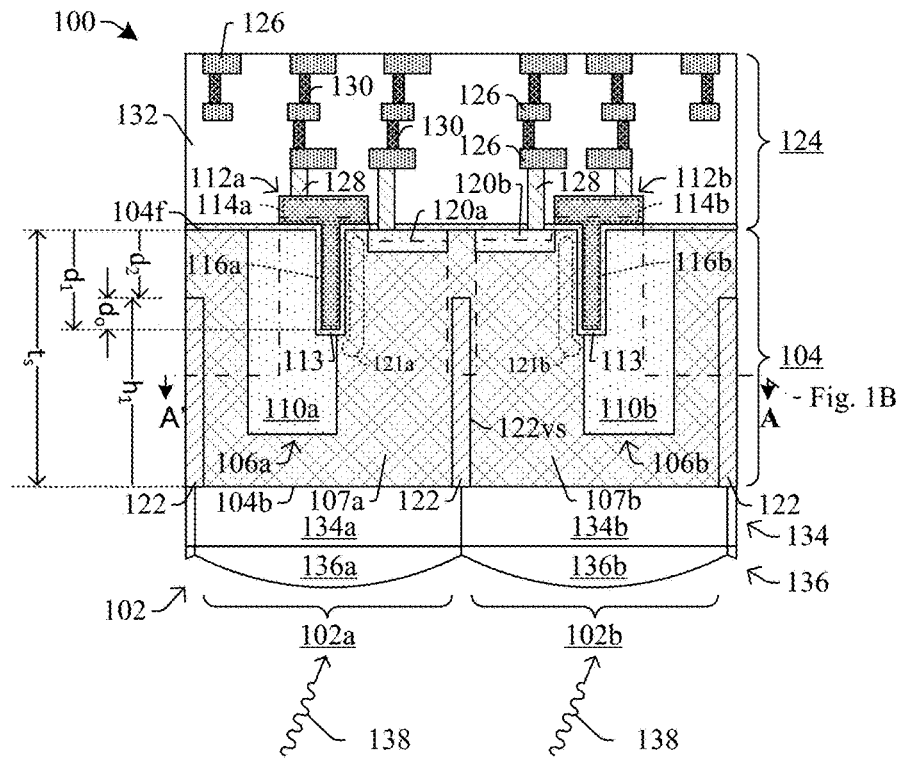
Fig. 1A
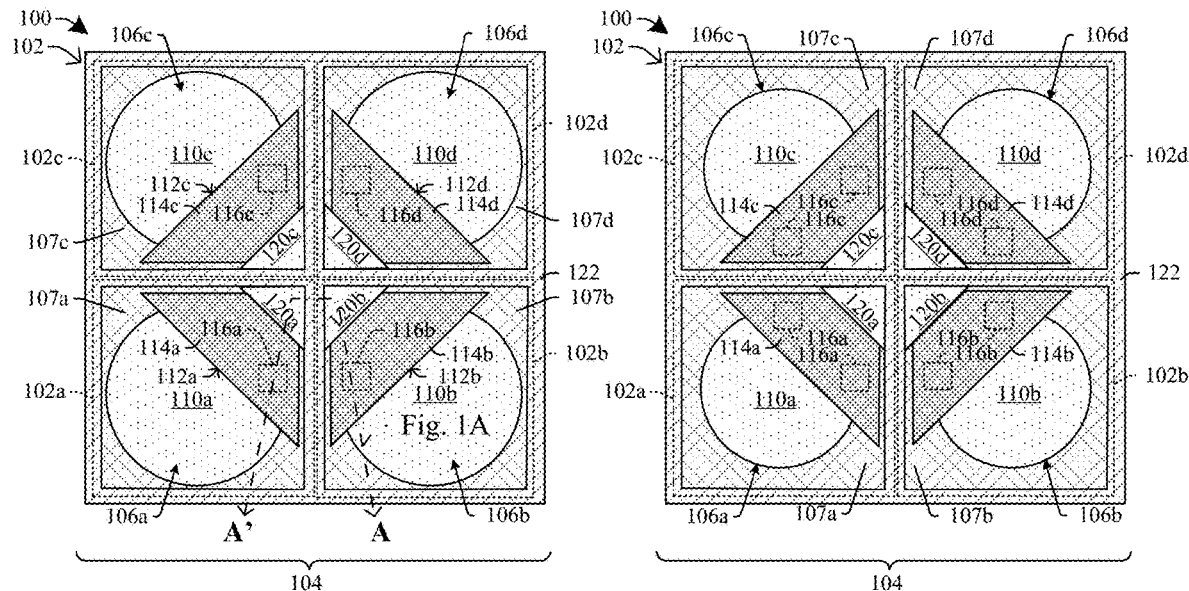
Fig. 1B  Fig. 1C

IMAGE SENSOR WITH OVERLAP OF BACKSIDE TRENCH ISOLATION STRUCTURE AND VERTICAL TRANSFER GATE

BACKGROUND

Complementary metal-oxide semiconductor (CMOS) image sensors are used in a wide range of modern-day electronic devices, such as, for example, cameras, tablets, smart phones, and so on. CMOS image sensors may be front-side illuminated (FSI) or back-side illuminated (BSI). Compared to FSI CMOS image sensors, BSI CMOS image sensors have better sensitivity, better angular response, and greater metal routing flexibility.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A illustrates a cross-sectional view of some embodiments of a semiconductor-on-insulator image sensor.

FIG. 1B illustrates a simplified top layout of some embodiments of the image sensor of FIG. 1A, wherein each pixel includes a transfer transistor with single vertical gate electrode portion.

FIG. 1C illustrates a simplified top layout of some other embodiments of the image sensor of FIG. 1A, wherein each pixel includes a transfer transistor with multiple vertical gate electrode portions.

DETAILED DESCRIPTION

Figure 2A:
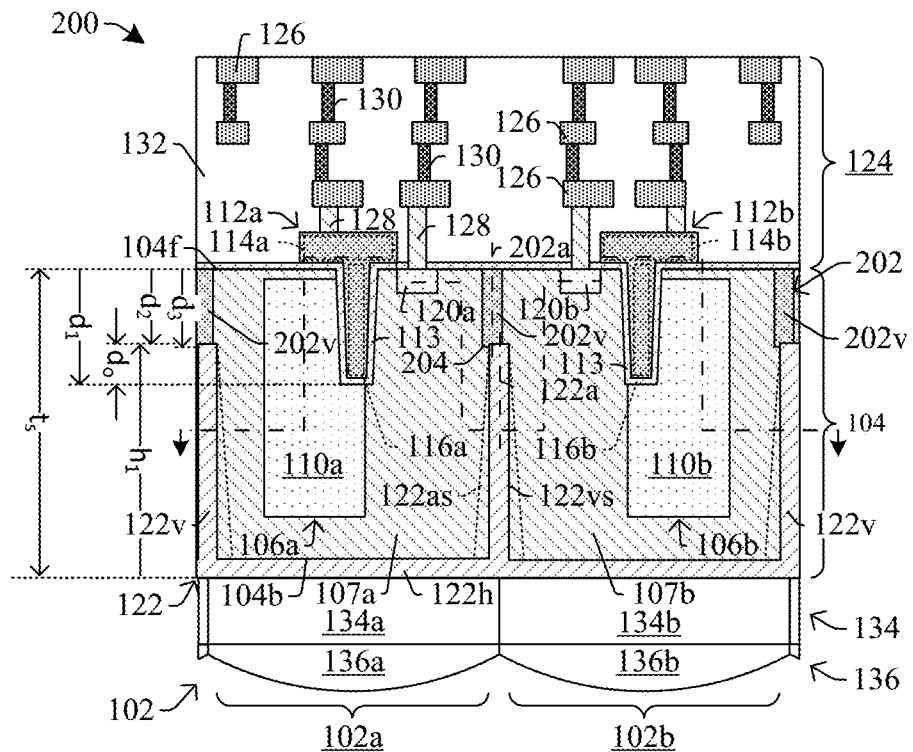
FIG. 2A illustrates a cross-sectional view of some more detailed embodiments of an image sensor.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

CMOS image sensors are used in a wide range of modern-day electronic devices, such as, for example, cameras, tablets, smart phones, and so on. CMOS image sensors include an array of pixels that are arranged in rows and columns on a semiconductor substrate. When incident light strikes the pixels, the intensity and/or color of the light generates respective electrical signals for the respective pixels, and these electrical signals are used to build a digital image. Ideally, the electrical signals from each pixel would correspond precisely to only the light incident on that pixel, however, some of the light from one pixel may "leak" over to other pixels through reflection or refraction, and/or electrical carriers generated at one pixel may "leak" over to another pixel through the substrate. These and other issues may manifest in various ways, and may be referred to in some contexts as cross-talk, blooming, etc.

To limit these effects, image sensors include backside isolation structures between adjacent pixels. Some backside isolation structures can extend from the backside of the semiconductor substrate through an entire thickness of the substrate. Though such isolation structures provide good isolation, it has been appreciated however that such structures make the resulting image sensor susceptible to cracking. Accordingly, in some aspects of the present disclosure, the backside isolation structures extend from a backside of the substrate towards the frontside of the substrate without extending fully through the substrate (e.g., the backside isolation structure extends only partially into the semiconductor substrate). Further, in these embodiments, one or more of the transistors of a pixel includes a gate electrode having a vertical portion that extends downward into a frontside of the substrate. The backside isolation structure has a vertical overlap with the vertical portion of the gate electrode. This vertical overlap provides reasonably good isolation between neighboring pixels and reduces the risk of cracking, such that the image sensor may have high optical and electrical isolation between photodetectors and may be manufactured with a high yield.

FIG. 1A and FIG. 1B, which are now referred to concurrently, depict some embodiments of an image sensor 100. More particularly, FIG. 1A illustrates a cross-sectional view of the image sensor 100, and FIG. 1B illustrates a corresponding top view of the image sensor 100, as indicated by section lines A-A'. It will be appreciated that FIG. 1A and FIG. 1B are simplified drawings, and other un-illustrated features are often present in actual implementations. Further, though FIG. 1B shows four pixels radially disposed around a central point, in other embodiments, other arrangements could be used—for example three pixels, five pixels, etc., could be arranged around a central point; or the pixels could lack a central point in other embodiments.

The image sensor 100 includes a plurality of pixels arranged in or on a semiconductor substrate 104. In the illustrated example, the pixels 102 include a first pixel 102a, second pixel 102b, third pixel 102c, and fourth pixel 102d arranged in grid-like fashion, though in general any number of pixels may be present. Because the pixels 102 generally have the same features as one another, rather than separately calling out each feature of each individual pixel, the description below will refer to the first pixel 102a with it being understood that the each described feature of the first pixel 102a is applicable to each of the other individual pixels. Further, it will be appreciated that while each of the pixels 102 generally have the same features as one another, one or more of the pixels (e.g., first pixel 102a) may have a layout that may be rotated and/or altered slightly relative to that the other pixels (e.g., second pixel 102b, third pixel 102c, and fourth pixel 102d) for example in order to "tile" the pixels 102 together in the grid.

The first pixel 102a includes a first photodetector 106a. The first photodetector 106a is defined by a photojunction where first bulk region 107a of the substrate 104 meets a first collector region 110a. The first bulk region 107a and the first collector region 110a have opposite doping types, such that the photojunction may, for example, be a PN junction or other suitable photojunction. For example, the first bulk region 107a may be p-type and the first collector region 110a may be n-type. The second pixel 102b, third pixel 102c, and fourth pixel 102d include a second photodetector 106b, third photodetector 106c, and fourth photodetector 106d, respectively; which include second bulk region 107b, third bulk region 107c, and fourth bulk region 107d, respectively; and second collector region 110b, third collector region 110c, and fourth collector region 110d.

The first pixel 102a further includes a first transfer transistor 112a disposed over the first photodetector 106a. The first transfer transistor 112a comprises a transfer gate electrode that includes a first lateral portion 114a extending over the frontside 104f of the semiconductor substrate 104 and a first vertical portion 116a extending to a first depth, $d_1$, below the frontside 104f of the semiconductor substrate 104. The first vertical portion 116a protrudes into the first collector region 110a, but is separated from the first collector region 110a by a transfer gate dielectric layer 113. The transfer gate dielectric layer 113 may be or comprise, for example, silicon dioxide, a high-k dielectric, and/or some other suitable dielectric(s). A first floating node 120a has the same doping type as the first collector region 110a and an opposite doping type as the first bulk region 107a, such that a first channel region 121a extends in the first bulk region 107a alongside the first vertical portion 116a of the first transfer gate electrode. The first transfer gate electrode may be or comprise, for example, doped polysilicon and/or some other suitable conductive material(s), such as a metal comprising copper, tungsten, aluminum or others. The illustrated embodiment also illustrates a second transfer transistor 112b, a third transfer transistor 112c, and a fourth transfer transistor 112d, respectively; having second lateral and vertical portions 114b, 116b; third lateral and vertical portions 114c, 116c; and fourth lateral and vertical portions 114d, 116d; respectively.

A backside trench isolation structure 122 extends from a backside 104b of the semiconductor substrate 104 to a second depth, $d_2$, below a frontside 104f of the semiconductor substrate 104, and laterally surrounds the individual bulk regions of the individual pixels to electrically and optically isolate the photodetectors from one another. Thus, the backside trench isolation structure 122 extends from the backside 104b of the substrate 104 partially towards the frontside 104f of the substrate 104, but does not pass through the entire thickness $t_s$ of substrate 104. The backside trench isolation structure 122 may, for example, be or comprise silicon dioxide and/or some other suitable dielectric(s). The backside trench isolation structure includes a number of ring-shaped structures, with each ring-shaped structure laterally surrounding the bulk region of a corresponding pixel, and the ring-shaped structures merge with one another to give the backside trench isolation structure a grid-like geometry.

The second depth $d_2$, is less than the first depth $d_1$, such that a lowermost portion of the first vertical portion 116a of the first transfer gate electrode has a vertical overlap distance, $d_o$, with an uppermost portion of the backside trench isolation structure 122. In some embodiments, a ratio of the first depth, $d_1$, to the second depth $d_2$ ranges from approximately 1.05 to 2.0, and/or the vertical overlap distance, $d_o$, ranges from 5% to 50% of the first depth $d_1$, and/or the vertical overlap distance, $d_o$, ranges from 5% to 50% of the second depth $d_2$. In some embodiments, the first depth, $d_1$, ranges from 525 nm to 1200 nm (and is approximately 600 nm in some embodiments), the second depth, $d_2$, ranges from 500 nm to 1000 nm (and is approximately 500 nm in some embodiments), and the vertical overlap distance, $d_o$, ranges from 25 nm to 700 nm (and is approximately 100 nm in some embodiments). Further, in some embodiments, a height, $h_1$, of the backside trench isolation structure 122 ranges from approximately 25% of the entire thickness, $t_s$, of the substrate 104 to approximately 95% of the entire thickness, $t_s$, of the substrate 104; and the vertical overlap distance, $d_o$, can range from approximately 5% of $h_1$ to approximately 50% of $h_1$ in some embodiments.

An interconnect structure 124 is disposed over the frontside 104f of the substrate 104. The interconnect structure 124 includes a plurality of wires 126, a plurality of contacts 128, and a plurality of vias 130 stacked over transfer transistors. The wires 126 and/or the vias 130 may be or comprise the same material, aluminum copper, aluminum, copper, some other suitable conductive material(s), or any combination of the foregoing. The contacts 128 may be or comprise, for example, tungsten, copper, aluminum copper, some other suitable conductive material(s), or any combination of the foregoing. A frontside dielectric layer 132 surrounds the wires 126, the contacts 128, the vias 130, and other structures on the frontside of the substrate 104. The frontside dielectric layer 132 may be or comprise, for example, silicon dioxide, a low k dielectric, silicon carbide, silicon nitride, some other suitable dielectric(s), or any combination of the foregoing.

In some embodiments, the pixels 102 are configured to detect different wavelengths of incident light, such as red light, green light, and blue light, for example. To facilitate this detection, the pixels include color filters 134 (e.g., first color filter 134a over first pixel 102a, second color filter 134b over second pixel 102b) and respective micro-lenses 136 (first micro-lens 136a over first pixel 102a, second micro-lens 136b over second pixel 102b). The various color filters 134 filter different wavelengths of light, for example, according to a Bayer-filter pattern, such that the pixels 102 detect different wavelengths of light. Thus, for example during operation, incident light 138 strikes the first micro-lens 136a, is directed through the first color filter 134a where the incident light 138 is filtered, and then the filtered light proceeds towards the first photodetector 106a of the first pixel 102a. The filtered light then interacts with the first photodetector 106a to be transformed into an electrical signal, which is processed by circuitry of the pixels (including first transfer transistor 112a and interconnect structure 124). Thus, the pixels 102 can collectively generate digital image data through these electrical signals.

Because the backside trench isolation structure 122 has vertical overlap, $d_o$, with the first vertical portion 116a of the first transfer gate electrode, the image sensor 100 may have high optical isolation and high electrical isolation between the first, second, third, and fourth photodetectors 106a-106d. The high optical isolation may lead to low cross-talk between the first, second, third, and fourth photodetectors 106a-106d and a high modulation transfer function. The high electrical isolation may lead to high full well capacity and hence high anti-blooming, while also being efficient to manufacture. Further, though the backside trench isolation structure 122 could in principle pass entirely through the substrate 104, limiting the extent of the backside trench isolation structure limits the risk of cracking the substrate 104 such that the illustrated implementation may provide higher yields than some other approaches.

While FIG. 1B illustrates an example wherein each pixel includes a transfer transistor with single vertical gate electrode portion, the transfer transistors can also include multiple vertical gate electrode portions. Thus, FIG. 1C illustrates another example wherein each pixel includes a transfer transistor with two vertical gate electrode portions. For example, the first pixel includes a first transfer transistor including a gate electrode with two first vertical portions 116a that are spaced apart under a first lateral portion 114a of first gate electrode. The presence of additional vertical gate electrode portions may aid in enabling faster charge transfer from a photodetector to a floating node. However, embodiments with a single vertical gate electrode portion as previously illustrated in FIG. 1B may in some cases provide pixels with a smaller footprint.

Figure 2B:
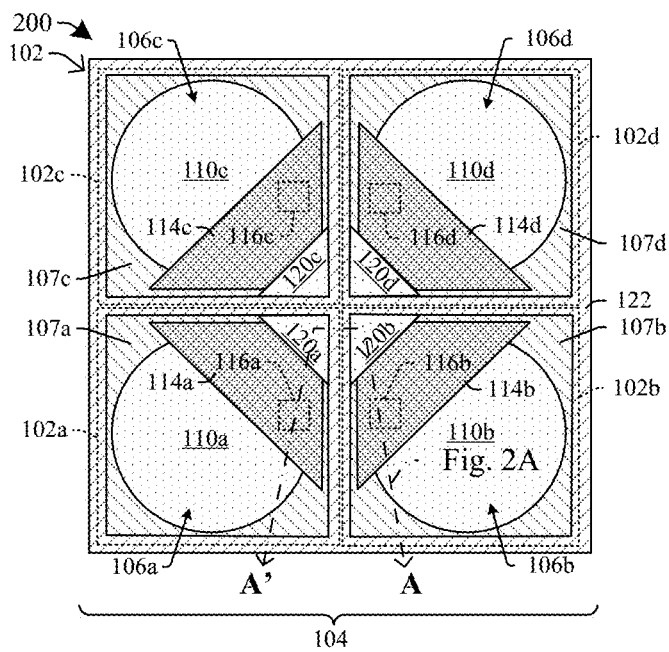
FIG. 2B illustrates a simplified top layout of some embodiments of the image sensor of FIG. 2A, wherein each pixel includes a transfer transistor with single vertical gate electrode portion.

With reference to FIG. 2A, a cross-sectional view of some more detailed embodiments of an image sensor 200 is provided. FIG. 2B provides an example of a top view consistent with FIG. 2A. The image sensor 200 may comprise some aspects of the image sensor 100 in FIGS. 1A-1C (and vice versa); and thus, the features explained above with regards to FIGS. 1A-1C are also applicable to the image sensor 200 in FIGS. 2A-2B.

As illustrated in FIG. 2A-2B, in some embodiments, rather than the backside trench isolation structure 122 having vertical sidewalls 122vs (see also FIG. 1A), the backside trench isolation structure 122 can have angled and/or tapered sidewalls 122as that are narrower closer to the frontside 104f of the substrate and wider closer to the backside 104b of the substrate. Further, the first vertical portion 116a of the first transfer gate electrode can also be angled or tapered, such that the bottommost portion of first vertical portion 116a has sidewalls that are narrower, while an upper portion of first vertical portion 116a has sidewalls that are wider. Further, in some embodiments, rather than the first bulk region 107a directly contacting the first color filter 134a (as previously illustrated in FIG. 1A), the backside trench isolation structure 122 can have a horizontal portion 122h covering the backside 104b of the substrate to separate the first bulk region 107a of substrate 104 from the first color filter 134a. Thus, in FIG. 2A, the backside trench isolation structure 122 comprises vertical segments 122v that establish a grid-like structure to separate the pixels 102 from one another, as well as a horizontal portion 122h covering the backside 104b of the substrate.

In addition to the features explained above with regards to FIGS. 1A-1C, the image sensor 200 of FIGS. 2A-2B further comprises a doped region 202 that includes vertical segments 202v extending from the frontside 102f of the substrate to a third depth $d_3$. The doped region 202 is disposed over the backside trench isolation structure 122 and laterally surrounds the bulk regions 107 to form a grid-like structure similar to that of the backside trench isolation structure 122, thereby helping to further isolate the first, second, third, and fourth photodetectors 106a-106d of the pixels from one another. In some embodiments, the third depth $d_3$ is equal to the second depth $d_2$ so the doped region meets the uppermost portion of the vertical segments 122v of the backside trench isolation structure 122. Thus, the doped region 202 and backside trench isolation structure 122 collectively span the entire thickness $t_s$ of the substrate 104 in some embodiments. The doped region 202 has a doping type that is the same as the bulk regions 107, and opposite to that of the floating nodes 120 and collector regions 110. For example, in some embodiments the floating nodes 120 and collector regions 110 can each be n-type semiconductor material, and the bulk regions 107 and doped region 202 are p-type semiconductor material. In some embodiments, the doped region 202 can have a doping concentration that is greater than that of the bulk regions 107—for example, the doped region 202 can have a first doping concentration ranging from 1e16 cm$^{-3}$ to 1e18 cm$^{-3}$, and the bulk regions 107 can have a second doping concentration ranging from 1e16 cm$^{-3}$ to 1e18 cm$^{-3}$.

In some embodiments the vertical segments 122v of the backside trench isolation structure 122 each have a first width, and the vertical segments 202v of the doped region 202 each have a second width that is equal to the first width, though the second width can also be smaller than or larger than the first width. Further, due to the manner in which the doped region 202 and the backside trench isolation structure 122 are formed, the doped region 202 can extend so vertical segments 202v of its grid-like structure have central axes that correspond to a first axis or plane 202a, and the backside trench isolation structure 122 can extend so vertical segments 122v of its grid-like structure have central axes that correspond to a second axis or plane 122a that is slightly offset from the first axis or plane 202a. This offset can arise from small misalignment that occurs during the photolithographic process used to manufacture these structures, resulting in the sidewalls and/or central axes of the backside trench isolation structure 122 and sidewalls and/or central axes of the doped region 202 being misaligned/offset. Further, due to the manner in which the doped region 202 and the backside trench isolation structure 122 are formed, the doped region 202 may have a bottommost surface that extends downward past an uppermost surface of the backside trench isolation structure 122 such that the third depth $d_3$ is slightly greater than the second depth $d_2$, resulting in a step-like feature 204 in the lower portion of the doped region 202.

Again the vertical overlap, $d_o$, between the backside trench isolation structure 122 and the vertical portion 116 of the transfer gate electrode provides the image sensor 200 with high optical isolation and high electrical isolation between the photodetectors 106. The high optical isolation may lead to low cross-talk between the first, second, third, and fourth photodetectors 106a-106d and a high modulation transfer function. The high electrical isolation may lead to high full well capacity and hence high anti-blooming, while also being efficient to manufacture.

Figure 3A:
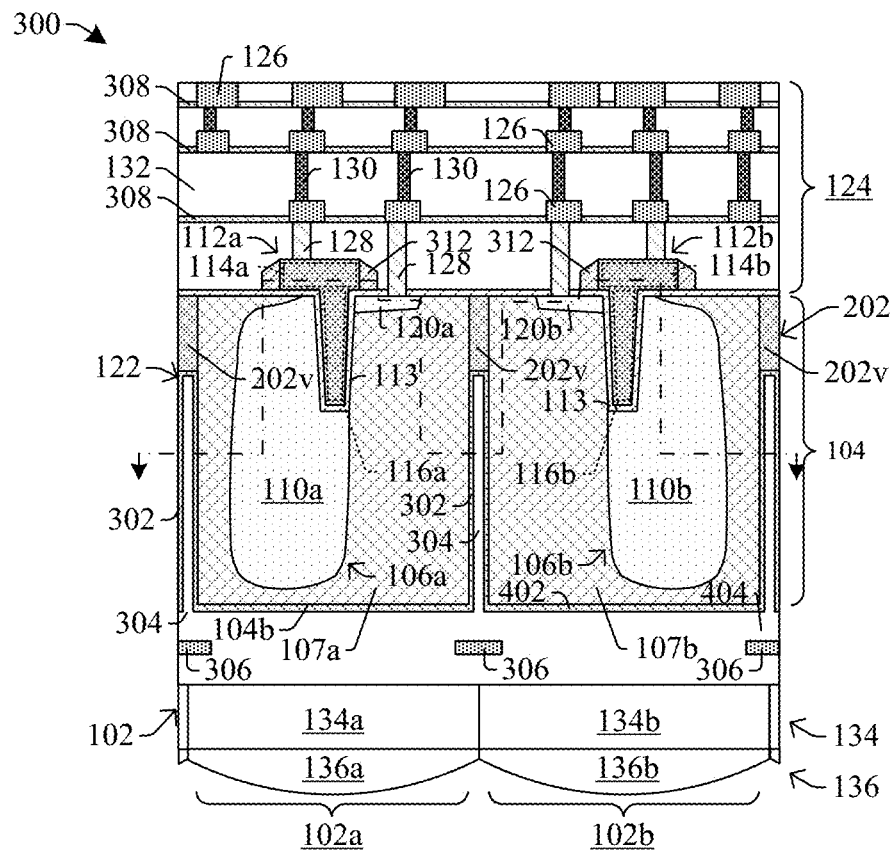
FIG. 3A illustrates a cross-sectional view of some more detailed embodiments of an image sensor.
Figure 3B:
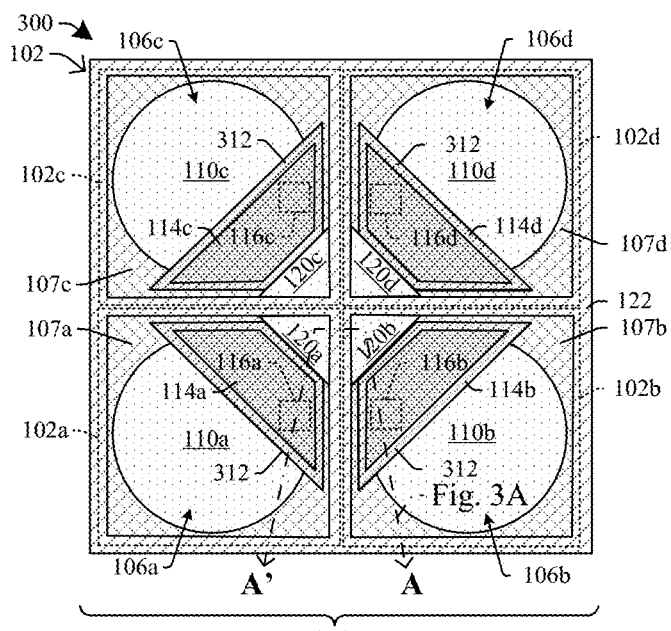
FIG. 3B illustrates a simplified top layout of some embodiments of the image sensor of FIG. 3A.

With reference to FIG. 3A, a cross-sectional view of some more detailed embodiments of an image sensor 300 is provided, while FIG. 3B provides a top view consistent with FIG. 3A. The image sensor 300 may comprise some aspects of the image sensor 100 in FIGS. 1A-1C (and vice versa), and/or the image sensor 200 in FIGS. 2A-2B (and vice versa); and thus, the features explained above with regards to FIGS. 1A-1C and/or FIGS. 2A-2B are also applicable to the image sensor 300 in FIGS. 3A-3B.

In addition to the previously discussed features, the transfer transistors in FIGS. 3A-3B also include sidewall spacers 312 disposed on sidewalls of the transfer gate electrodes. The sidewall spacers 312 may be or comprise, for example, silicon dioxide, silicon nitride, some other suitable dielectric(s), or any combination of the foregoing.

Further still, the backside trench isolation structure 122 of image sensor 300 is defined by a backside dielectric liner 302 and a backside dielectric layer 304. The backside dielectric liner 302 lines a backside of the substrate 104 and separates a backside dielectric layer 304 of the backside trench isolation structure from the bulk regions 107 of substrate 104. The backside dielectric liner 302 may, for example, be or comprise a high k dielectric layer and/or some other suitable dielectric(s). The backside dielectric layer 304 may, for example, be or comprise silicon dioxide and/or some other suitable dielectric(s). The backside dielectric layer 304 covers the backside dielectric liner 302 on the backside of the substrate 104 and accommodates shielding 306.

The shielding 306 prevents radiation received from the backside of the substrate 104 from impinging on the backside trench isolation structure 122. Further, sidewalls of the shielding 306 reflect radiation received from the backside of the substrate 104 towards the first, second, third, and fourth photodetectors 106a-106d to reduce cross-talk and enhance quantum efficacy of the image sensor. The shielding 306 includes a plurality of segments that are individual to and respectively underlie segments of the backside trench isolation structure 122. The shielding 306 may, for example, be or comprise metal and/or some other suitable reflective material(s).

The interconnect structure 124 includes a plurality of wires 126, a plurality of contacts 128, a plurality of vias 130 disposed within inter-metal dielectric (IMD) layers 132 that are stacked on the frontside of the substrate 104 and are separated from each other by a plurality of etch stop layers 308. The IMD layers 132 and the etch stop layers 308 collectively define a frontside dielectric layer on the frontside of the substrate 104. The IMD layers 132 may be or comprise, for example, silicon dioxide, a low k dielectric, some other suitable dielectric(s), or any combination of the foregoing. The etch stop layers 308 may be or comprise, for example, silicon nitride, silicon carbide, some other suitable etch stop material(s), or any combination of the foregoing.

Figure 4A:
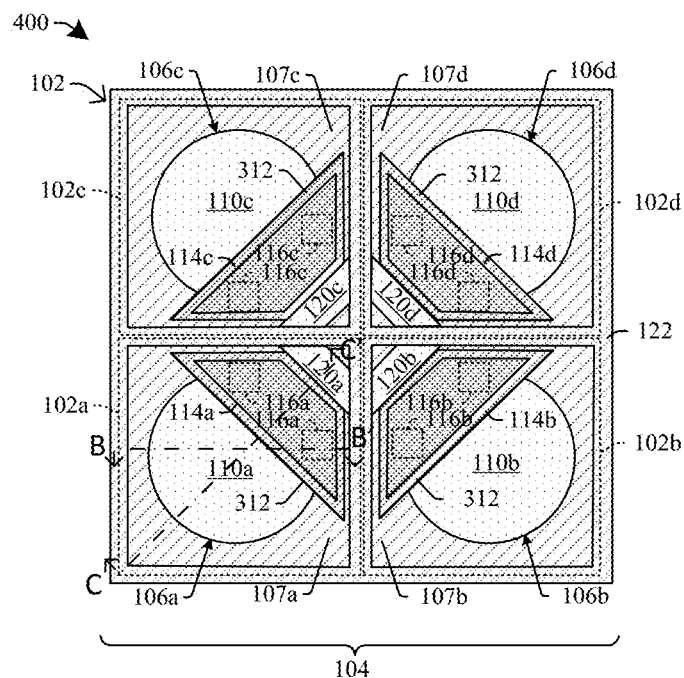
FIG. 4A illustrates a cross-sectional view of some more detailed embodiments of an image sensor including a depletion mode vertical transfer gate transistor normally ON at zero gate-source voltage.
Figure 4B:
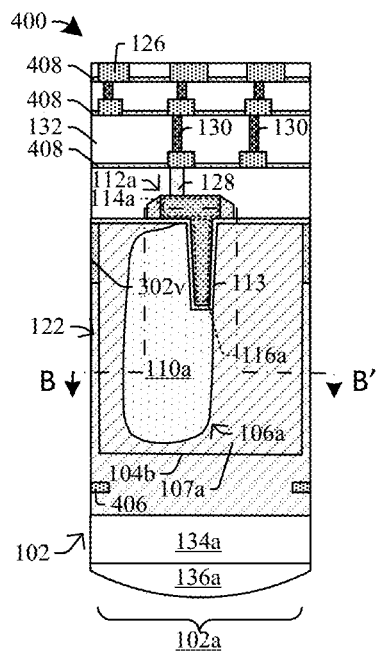
FIGS. 4B and 4C illustrate a simplified top layout of some embodiments of the image sensor of FIG. 4A.

With reference to FIG. 4A, a cross-sectional view of some more detailed embodiments of an image sensor 400 is provided, while FIG. 4B provides a top view consistent with FIG. 4A. The image sensor 400 may comprise some aspects of the image sensor 100 in FIGS. 1A-1C (and vice versa), and/or the image sensor 300 in FIGS. 2A-2B (and vice versa), and/or the image sensor 300 in FIGS. 3A-3B (and vice versa); and thus, the features explained above with regards to FIGS. 1A-1C and/or FIGS. 2A-2B and/or FIGS. 3A-3B are also applicable to the image sensor 400 in FIGS. 4A-4B.

Figure 4C:
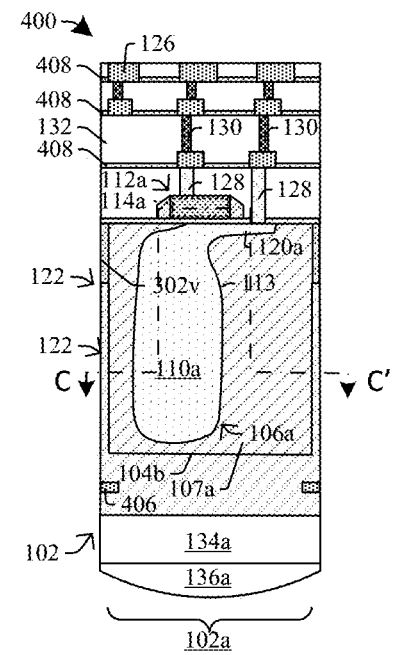

FIG. 4A-4C collectively depict an example where the vertical transfer transistor is a depletion mode transistor. Thus, as shown in FIG. 4C, under some portions of the gate electrode, the first collector region 110a may be n-type and may extend continuously between the first floating node 120a and the first collector region 110a. Thus, in the absence of a positive gate-source voltage, the transfer transistor is "on" (conducting), and to turn the transistor off, a gate-source voltage is applied to deplete carriers from the first collector region 110a under the gate electrode, thereby pinching off the transistor and isolating the first floating node 120a from the first collector region 110a.

Figure 5:
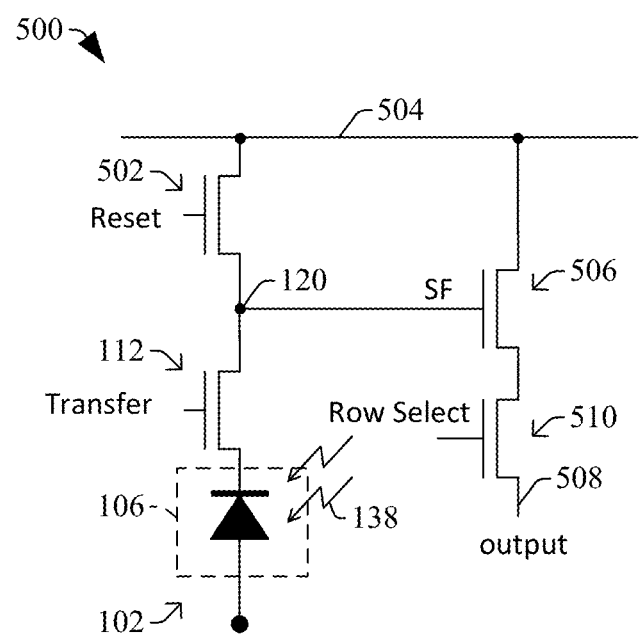
FIG. 5 illustrates a circuit diagram of some embodiments of an image sensor.

With reference to FIG. 5, a circuit diagram 500 of some embodiments including the image sensor of FIGS. 1A-1B is provided.

As shown, the image sensor of FIG. 5 includes one or more pixels 102 having one or more corresponding photodetectors 106 electrically connected by way of a transfer transistor 112. The photodetector 106 accumulates charge (e.g., electrons) from photons incident on the photodetector 106. The transfer transistor 112 selectively transfers charge from the photodetector 106 to the image sensor. A reset transistor 502 is electrically connected between a power source 504 and the floating node to selectively clear charge at the floating node. A source follower transistor 506 is electrically connected between the power source 504 and an output 508, and is gated by the floating node 120, to allow the charge at the floating node 120 to be observed without removing the charge. A row select transistor 510 is electrically connected between the source follower transistor 506 and the output 508 to selectively output a voltage proportional to the voltage at the floating node 120.

During use of the image sensor of FIG. 5, the pixel 102 is exposed to an optical image for a predetermined integration period. Over this period of time, the pixel 102 records the intensity of light incident on the photodetector 106 by accumulating charge proportional to the light intensity in collector regions (not shown) of the photodetectors 106. After the predetermined integration period, the amount of accumulated charge is read for each of the photodetectors 106. In some embodiments the amount of accumulated charge for a photodetector 106 is read by momentarily activating the reset transistor 502 to clear the charge stored at the floating node 120. Thereafter, the row select transistor 510 is activated and the accumulated charge of the photodetector 106 is transferred to the floating node 120 by activating the transfer transistor 112 for a predetermined transfer period. During the predetermined transfer period, the voltage at the output 508 is monitored. After the predetermined transfer period, the change in the voltage observed at the output 508 is proportional to the intensity of light recorded at the photodetector 106.

Figure 6:
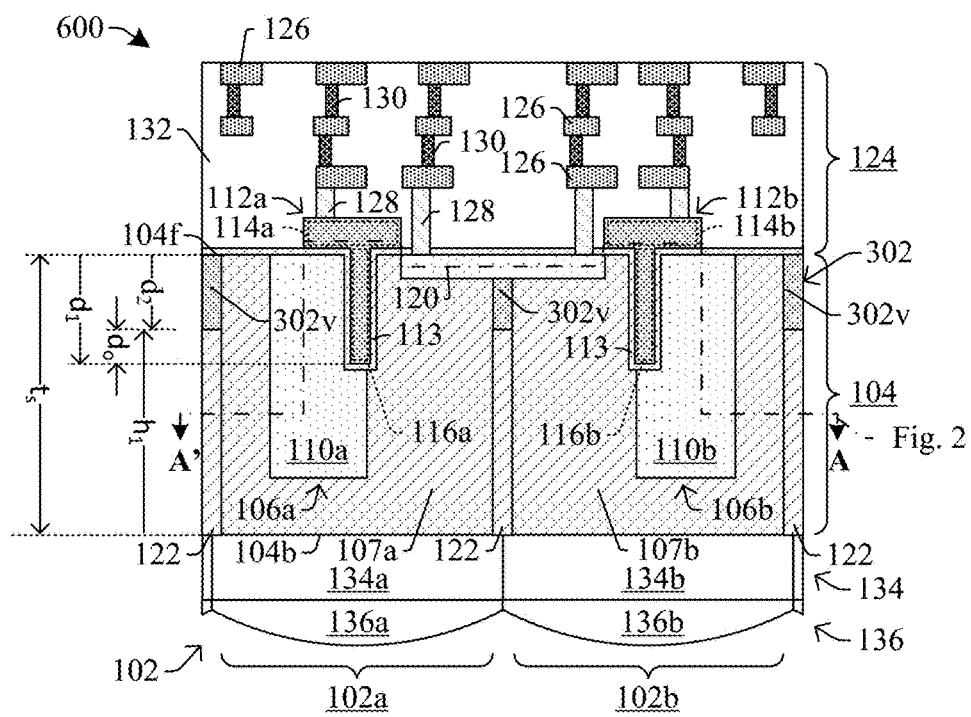
FIG. 6 illustrates a cross-sectional view of some more detailed embodiments of an image sensor.
Figure 7:
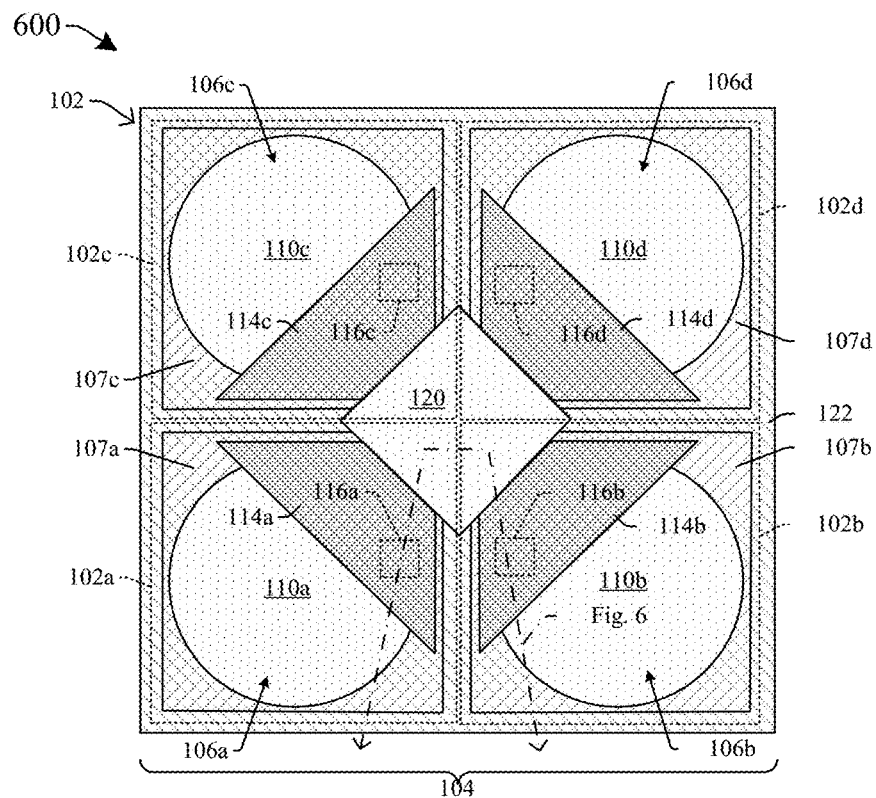
FIG. 7 illustrates a simplified top layout corresponding to some embodiments of the image sensor of FIG. 6.

FIG. 6 and FIG. 7, which are now referred to concurrently, depict some embodiments of an image sensor 600. More particularly, FIG. 6 illustrates a cross-sectional view of the image sensor 600, and FIG. 7 illustrates a corresponding top view of the image sensor 600, as indicated by section line A-A'. FIG. 6 and FIG. 7 are similar to FIGS. 1A-1B, except whereas FIGS. 1A-1B illustrated a case where each pixel had a separate floating diffusion node, FIGS. 6-7 illustrate a case where a single floating node 120 is shared by each of the pixels. In FIGS. 6-7, the single floating diffusion node 120 has a lower surface that forms a junction with an uppermost surface of the vertical segment 302v directly under the single floating node 120.

Figure 8:
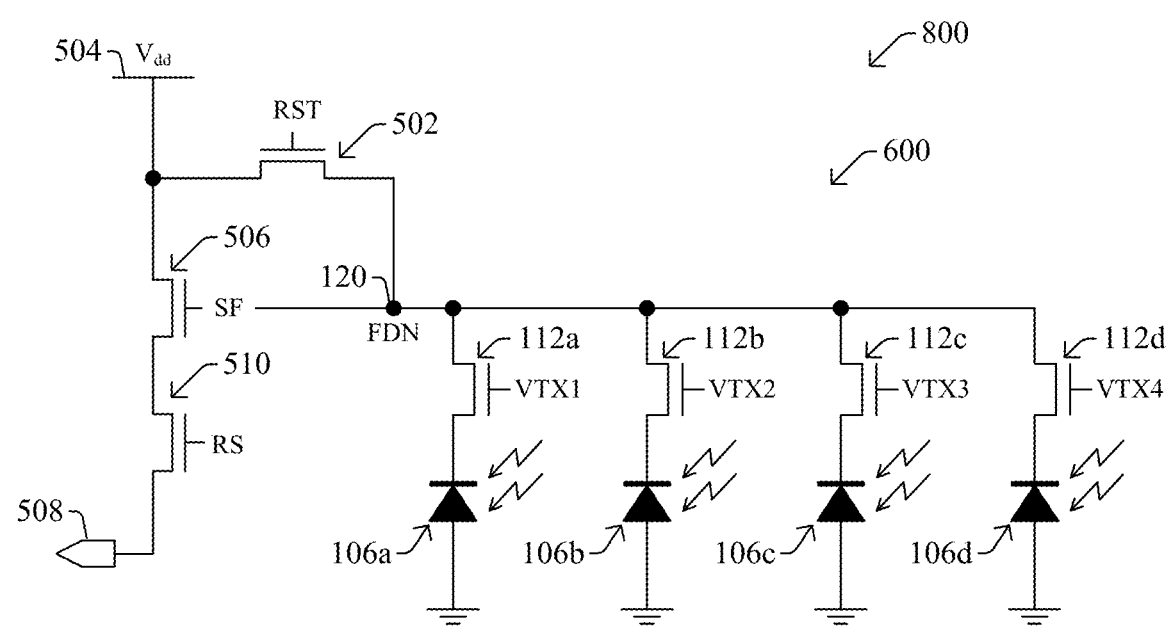
FIG. 8 provides a circuit diagram of an image sensor according to some embodiments consistent with FIGS. 6-7.

FIG. 8 provides a circuit diagram 800 of the image sensor 600 according to some embodiments consistent with FIGS. 6-7. As shown, the image sensor 600 includes one or more photodetectors 106a-d electrically connected to a floating node 120 by way of corresponding transfer transistors 112a-d, respectively. The photodetectors 106a-d accumulate charge (e.g., electrons) from photons incident on the photodetectors 106a-d. The transfer transistors 112a-d selectively transfer charge from the photodetectors 106a-d, respectively to the floating node 120. A reset transistor 502 is electrically connected between a power source 504 and the floating node 120 to selectively clear charge at the floating node 120. A source follower transistor 506 is electrically connected between the power source 504 and an output 508, and gated by the floating node 120, to allow the charge at the floating node 120 to be observed without removing the charge. A row select transistor 510 is electrically connected between the source follower transistor 506 and the output 508 to selectively output a voltage proportional to the voltage at the floating node 120.

During use of the image sensor 600, the image sensor 600 is exposed to an optical image for a predetermined integration period. Over this period of time, the image sensor 600 records the intensity of light incident on the photodetectors 106a-d by accumulating charge proportional to the light intensity in collector regions (not shown) of the photodetectors 106a-d. After the predetermined integration period, the amount of accumulated charge is read for each of the photodetectors 106a-d. In some embodiments the amount of accumulated charge for a photodetector is read by momentarily activating the reset transistor 502 to clear the charge stored at the floating node 120. Thereafter, the row select transistor 510 is activated and the accumulated charge of the photodetector (e.g., first photodetector 106a) is transferred to the floating node 120 by activating a transfer transistor (e.g., first transfer transistor 112a) of a corresponding photodetector (e.g., first photodetector 106a) for a predetermined transfer period. During the predetermined transfer period, the voltage at the output 508 is monitored. As the charge is transferred, the voltage at the output 508 varies. After the predetermined transfer period, the change in the voltage observed at the output 508 is proportional to the intensity of light recorded at the photodetector. The light incident on the other photodetectors (e.g., 106b-106d) can then be similarly measured.

With reference to FIGS. 9-17, a series of cross-sectional views 900-1700 of some embodiments of a method for forming an image sensor is provided.

Figure 9:
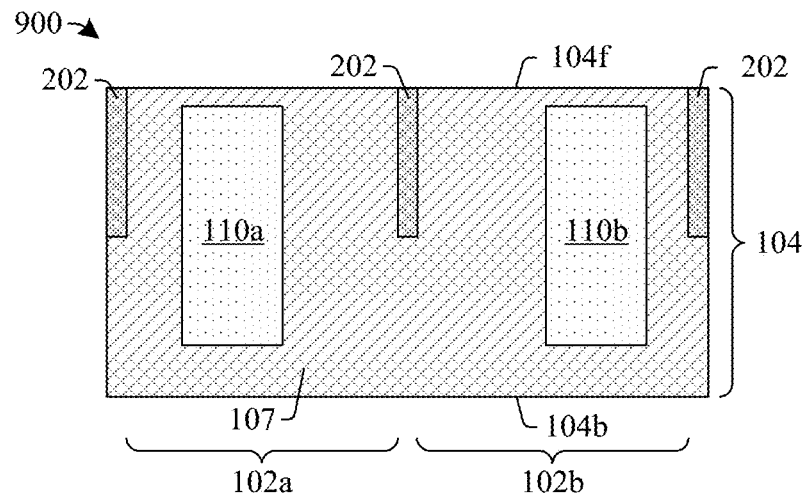
FIGS. 9-17 illustrate a series of cross-sectional views of some embodiments of a method for forming an image sensor.

As illustrated by the cross-sectional view 900 of FIG. 9, a series of selective doping processes is performed into a substrate 104 to form collector regions 110a, 110b and a doped region 202. The substrate 104 includes a frontside 104f and a backside 104b and may, for example, be a bulk monocrystalline silicon substrate, a semiconductor on insulator (SOI) substrate, or some other suitable semiconductor substrate.

The collector regions 110a, 110b are individual to pixels, and share a common doping type that is opposite to that of the bulk region 107 and doped region 202. For example, the bulk regions 107 and the doped region 202 can have a p-type doping, and the collector regions 110a, 110b can have n-type doping. For example, the doped region 202 can have a doping concentration ranging from 1e16 cm-3 to 1e18 cm-3, the bulk regions 107 can have a doping concentration ranging from 1e16 cm-3 to 1e18 cm-3, and collector regions 110a, 110b can have a doping concentration ranging from 1e16 cm-3 to 1e18 cm-3.

In some embodiments, the selective doping processes are performed by selective ion implantations or some other suitable selective doping processes. For example, a first selective ion implantation may be performed to form the collector regions 110a, 110b, and a second selective ion implantation may subsequently be performed to form the doped region 202. A selective ion implantation may, for example, comprise forming a photoresist mask by photolithography, performing ion implantation into the substrate 104 with the photoresist mask in place, and removing the photoresist mask.

Figure 10:
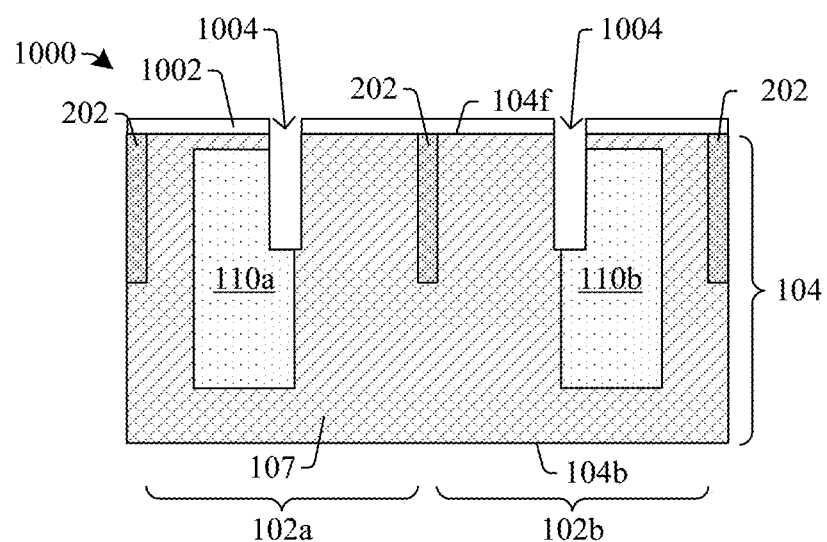

As illustrated by the cross-sectional view 1000 of FIG. 10, a trench hard mask 1002 is formed on the frontside 104f of the semiconductor substrate 104. The trench hard mask 1002 has a layout for trenches of transfer gate electrodes being formed. The trench hard mask 1002 may, for example, be formed by depositing a hard mask layer and subsequently patterning the hard mask layer into the trench hard mask 1002. The trench hard mask 1002 may be or comprise, for example, silicon nitride and/or some other suitable hard mask material.

Also illustrated by the cross-sectional view 1000 of FIG. 10, an etch is performed into the frontside 104f of the semiconductor substrate 104. The etch is performed with the trench hard mask 1002 in place and forms trenches 1004 individual to and respectively at the pixels 102. In some embodiments, the first etch forms the trenches 1004 with a depth $D_T$ of about 250-450 nanometers (nm), about 250-350 nm, about 350-450 nm, or some other suitable value. Further, in some embodiments, the first etch forms the trenches 1004 with a width $W_T$ of about 80-150 nm, about 80-105 nm, about 105-150 nm, or some other suitable value.

Figure 11:
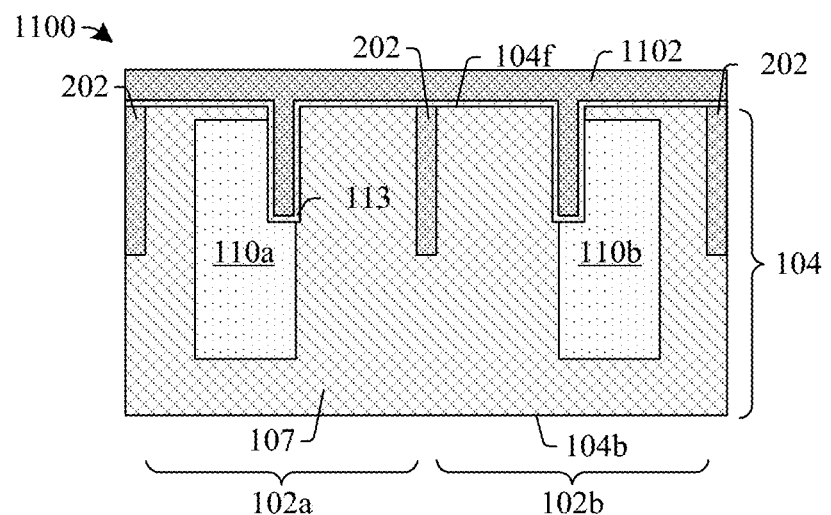

As illustrated by the cross-sectional view 1100 of FIG. 11, a transfer gate dielectric layer 113 is formed on the substrate 104. The transfer gate dielectric layer 113 may be or comprise, for example, silicon dioxide and/or some other suitable dielectric. Further, the transfer gate dielectric layer 113 may, for example, be formed by in situ steam generation (ISSG), vapor deposition, or some other suitable growth and/or deposition process.

Also illustrated by the cross-sectional view 1100 of FIG. 11, a transfer gate layer 1102 is formed over the transfer gate dielectric layer 113. The transfer gate layer 1102 may, for example, be or comprise doped polysilicon and/or some other suitable conductive material(s). The transfer gate layer 1102 may, for example, be formed by vapor deposition and/or some other suitable deposition process.

Figure 12:
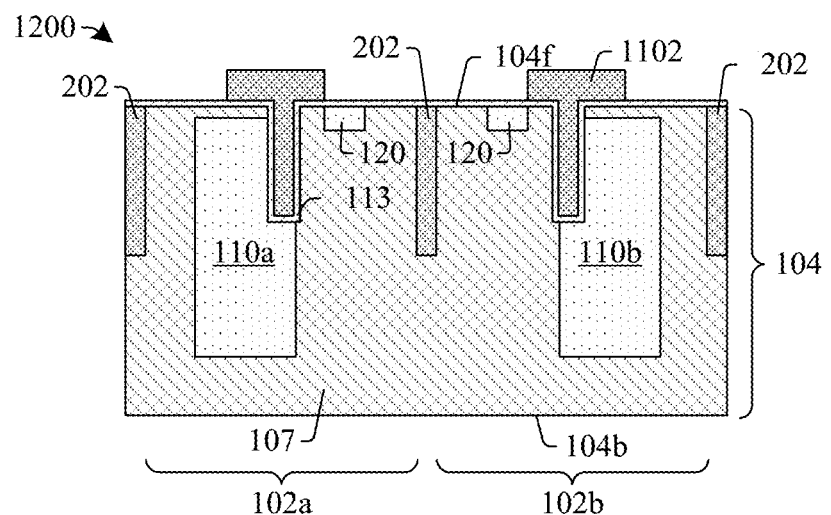

As illustrated by the cross-sectional view 1200 of FIG. 12, the transfer gate layer 1102 (see FIG. 11) is patterned to form transfer gate electrodes individual to and respectively at the pixels 102a, 102b. The transfer gate electrodes may, for example, have top layouts as shown in FIG. 1B and/or FIGS. 2B and/or 3B and/or 4A. In some embodiments, a process for patterning the transfer gate layer 1102 comprises: 1) depositing an antireflective coating (ARC); 2) patterning the ARC and the transfer gate layer 1102 by a photolithography/etching process; and 3) removing the ARC. Other processes are, however, amenable.

Also illustrated by the cross-sectional view 1200 of FIG. 12, floating nodes 120 are formed in the bulk regions 107. The floating nodes 120 can be individual to and respectively at the pixels 102a, 102b. The floating nodes 120 may, for example, have top layouts as shown in FIG. 1B and/or FIGS. 2B and/or 3B and/or 4A. The floating nodes 120 may, for example, be formed by selective ion implantation and/or some other suitable selective doping process. Selective ion implantation may, for example, comprise forming a photoresist mask by photolithography, performing ion implantation with the photoresist mask in place, and removing the photoresist mask.

Figure 13:
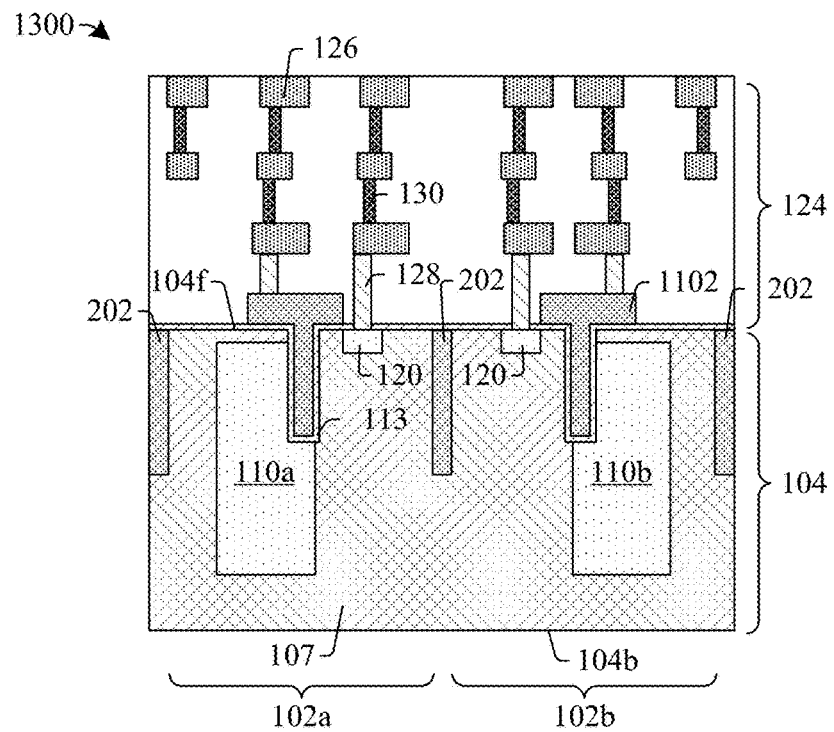

As illustrated by the cross-sectional view 1300 of FIG. 13, a frontside dielectric layer 132 is formed over the transfer gate electrodes. The frontside dielectric layer 132 may, for example, be or comprise silicon dioxide, a low-k dielectric, and/or some other suitable dielectric(s). In some embodiments, a process for forming the frontside dielectric layer 132 comprises: 1) depositing the frontside dielectric layer 132; and 2) performing a planarization into the top surface of the frontside dielectric layer 132. As further illustrated by the cross-sectional view 1300 of FIG. 13, an interconnect structure 124 is formed in and/or over the frontside dielectric layer 132. The interconnect structure 124 comprises a plurality of wires 126, a plurality of contacts 128, and a plurality of vias 130.

Figure 14:
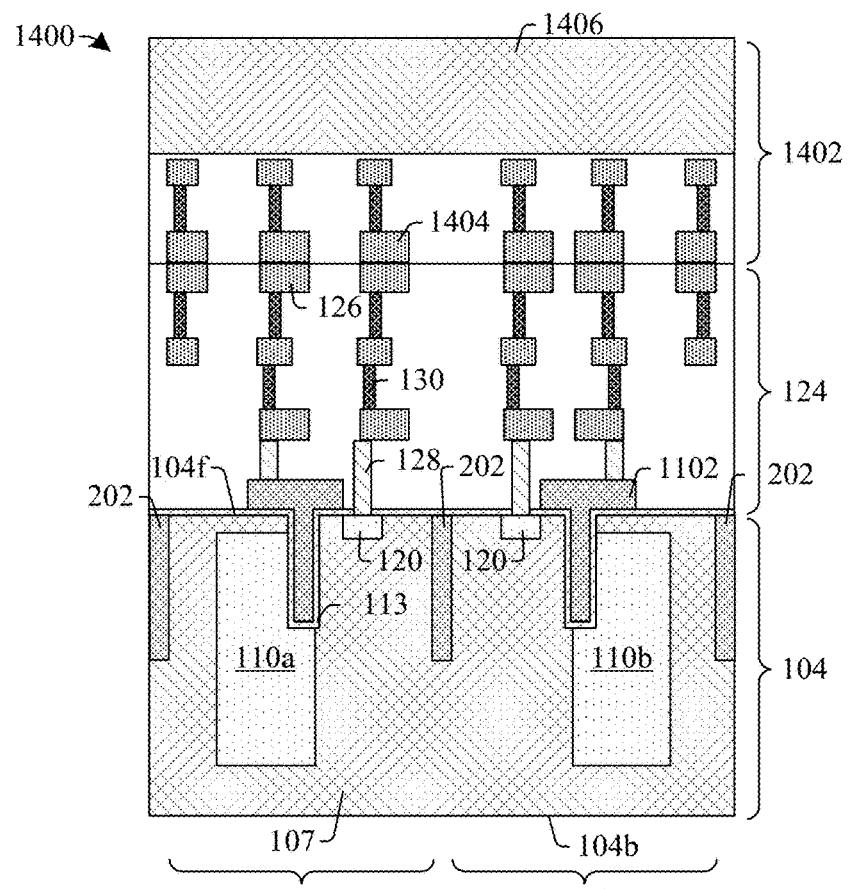

As illustrated by the cross-sectional view 1400 of FIG. 14, the structure of FIG. 13 is flipped vertically and bonded to an integrated circuit (IC) chip 1402. The bonding may, for example, be or comprise hybrid bonding or some other suitable bonding. The IC chip 1402 is only partially shown but comprises semiconductor substrate 1406, and a plurality of wires 1404 along a top surface. The wires 1404 of the IC chip 1402 are complementary to the wires 126 of the interconnect structure 124 and provide electrically coupling between the interconnect structure 124 and the IC chip 1402.

Figure 15:
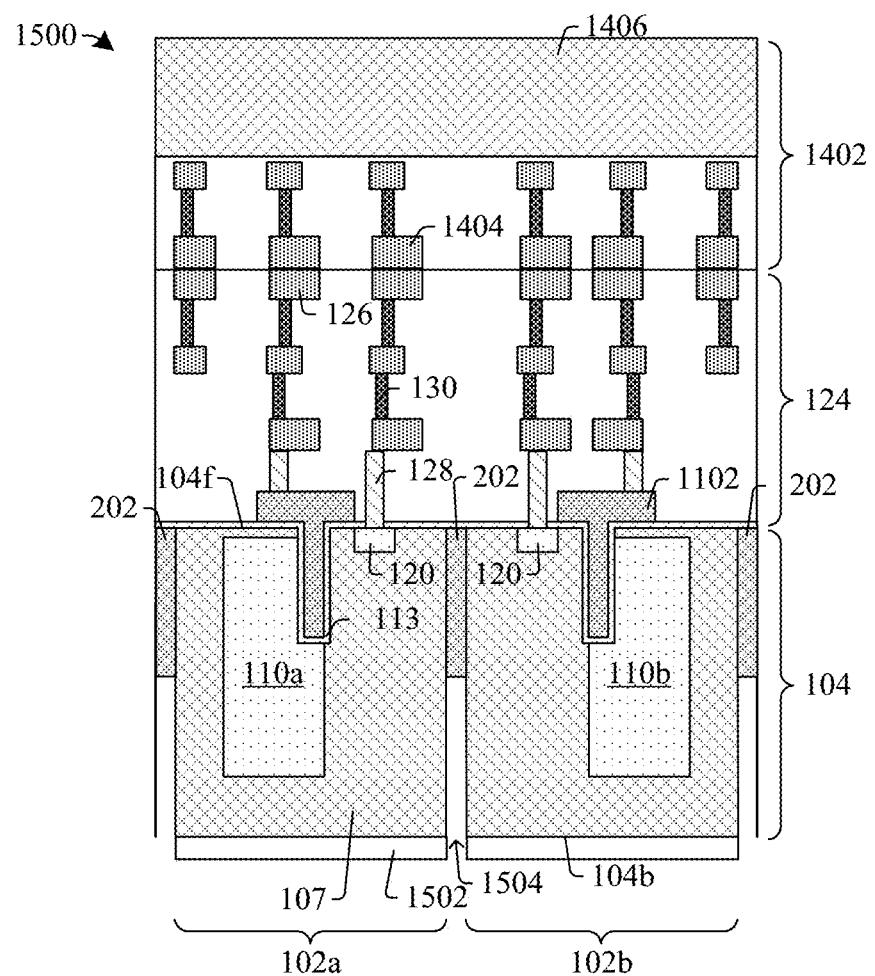

As illustrated by the cross-sectional view 1500 of FIG. 15, a mask 1502 is formed on the backside of the substrate, and an etch is carried out with the mask in place to form a backside trench structure 1504. In some embodiments, the etch is a dry etch that provides the backside trench structure with substantially vertical sidewalls, while in other embodiments the etch has a horizontal component that gives the sidewalls a tapered profile (e.g., wider near the backside of the substrate, and more narrow closer to the frontside of the substrate).

Figure 16:
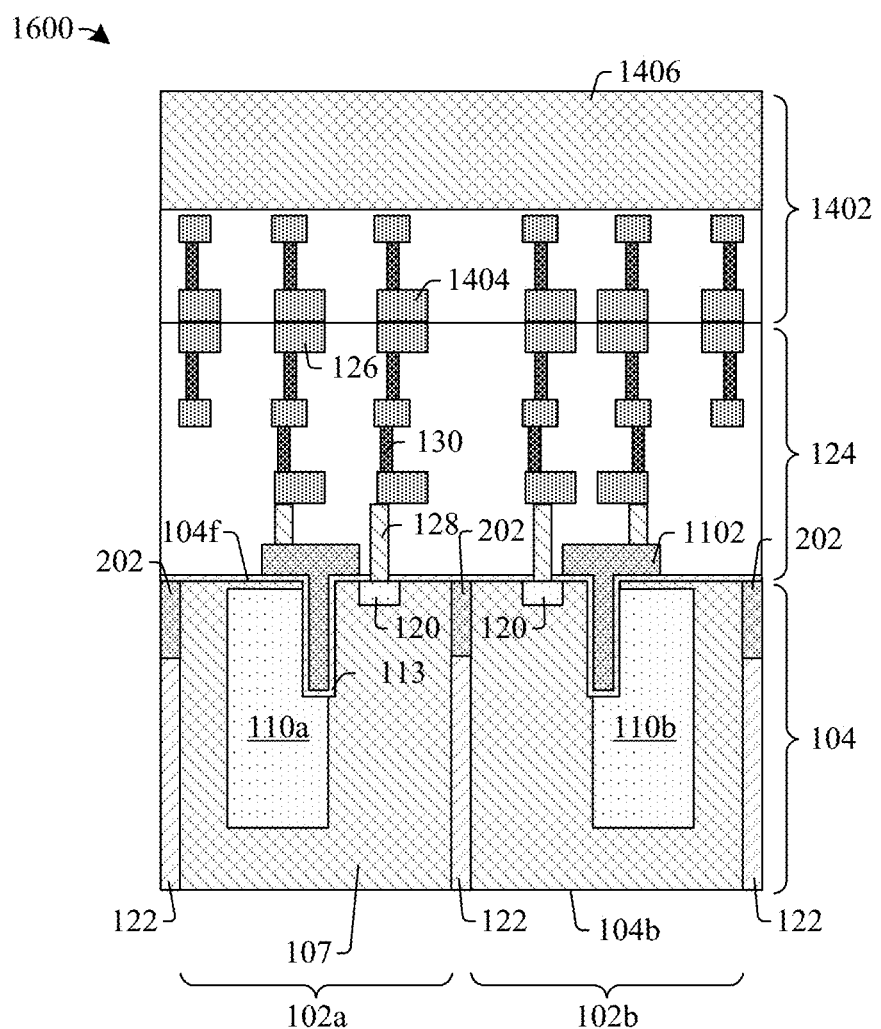

As illustrated by the cross-sectional view 1600 of FIG. 16, a dielectric is formed to fill in the backside trench structure 1504, thereby forming backside trench isolation structure 122. In some embodiments, the dielectric is formed through a chemical vapor deposition (CVD) process, a plasma vapor deposition process (PVD), or a spin-on process, for example. The dielectric meets with the doped region 202 to provide electrical and optical isolation between adjacent pixels. When formed, an uppermost portion of the dielectric has a vertical overlap with a lowermost portion of the vertical portion of the gate electrodes. This configuration helps to limit risk of unwanted cracks forming in the substrate 104, and provides good electrical and optical isolation between neighboring pixels.

Figure 17:
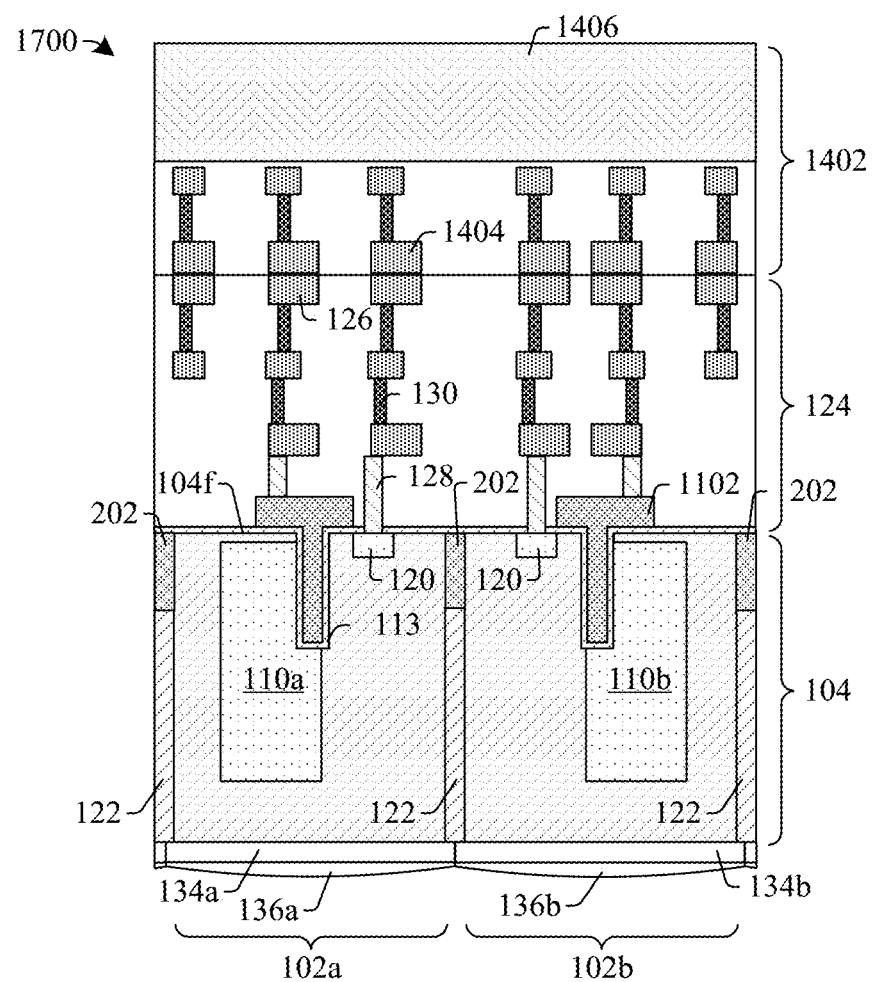

As illustrated by the cross-sectional view 1700 of FIG. 17, color filters 134*a*, 134*b* and micro-lenses 136*a*, 136*b* are then formed on the backside of the substrate.

While FIGS. 9-17 are described with reference to a method, it will be appreciated that the structures shown in FIGS. 9-17 are not limited to the method but rather may stand alone separate of the method. Further, while FIGS. 9-17 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 18:
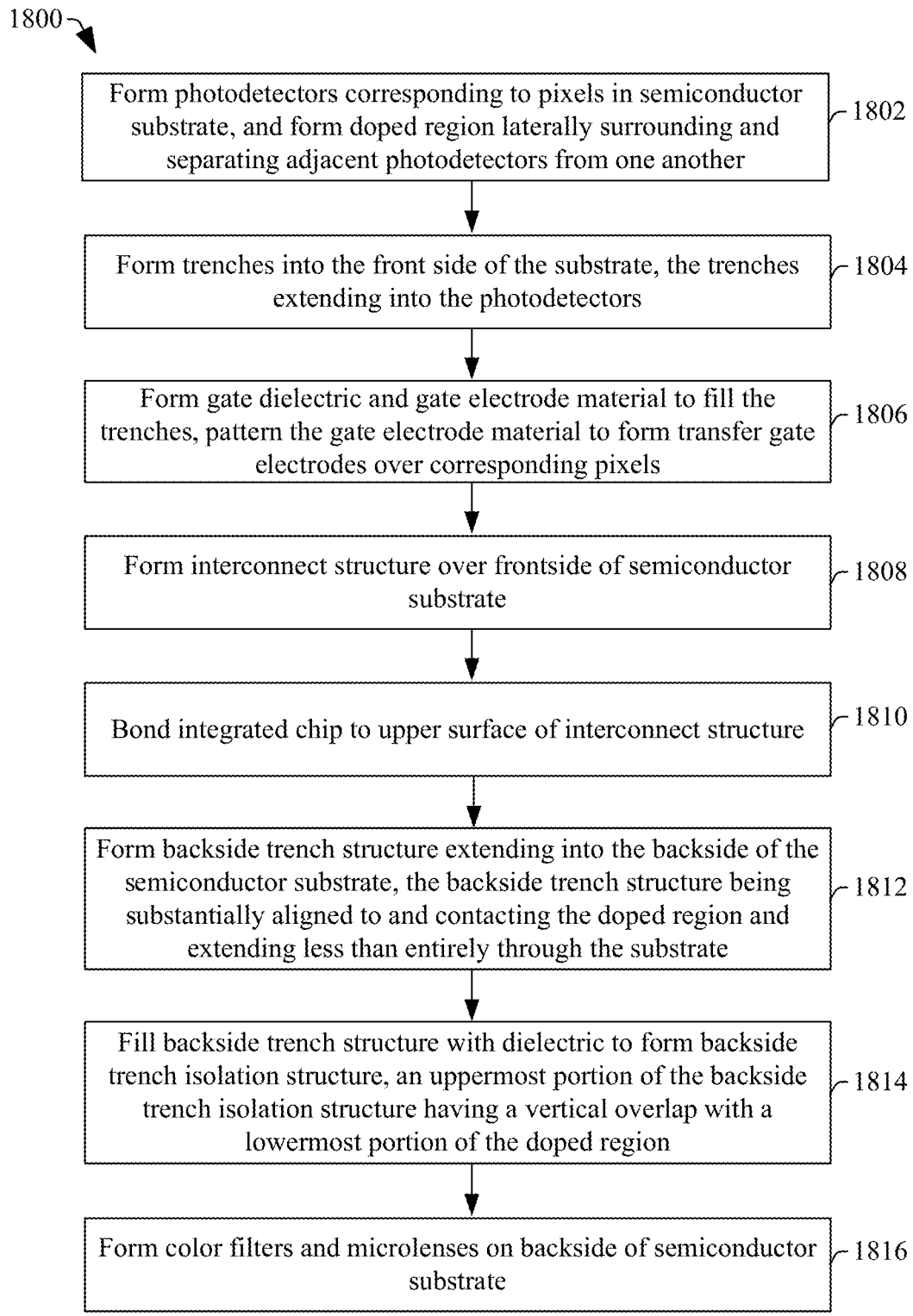
FIG. 18 illustrates a block diagram of some embodiments of the method of FIGS. 9-17.

With reference to FIG. 18, a block diagram 1800 of some embodiments of the method of FIGS. 9-17 is provided.

At 1802, photodetectors corresponding to pixels in semiconductor substrate are formed, and a doped region laterally surrounding and separating adjacent photodetectors from one another is formed. See, for example, FIG. 9.

At 1804, trenches are formed into the front side of the substrate. The trenches extend into the photodetectors. See, for example, FIG. 10.

At 1806, a gate dielectric and gate electrode material are formed to fill the trenches. The gate electrode material is patterned to form transfer gate electrodes over corresponding pixels. See, for example, FIGS. 11-12.

At 1808, an interconnect structure is formed over the frontside of semiconductor substrate. See, for example, FIG. 13.

At 1810, an integrated chip is bonded to an upper surface of interconnect structure. See, for example, FIG. 14.

At 1812, a backside trench structure is formed to extend into the backside of the semiconductor substrate. The backside trench structure is substantially aligned to and contacts the doped region and extends less than entirely through the substrate. See, for example, FIG. 15.

At 1814, the backside trench structure is filled with dielectric to form a backside trench isolation structure. An uppermost portion of the backside trench isolation structure has a vertical overlap with a lowermost portion of the doped region. See, for example, FIG. 16.

At 1816, color filters and micro-lenses are formed on a backside of the semiconductor substrate. See, for example, FIG. 17.

While the block diagram 1800 of FIG. 18 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application is directed towards an image sensor device. A photodetector is disposed in a semiconductor substrate, and a transfer transistor is disposed over photodetector. The transfer transistor includes a transfer gate having a lateral portion extending over a frontside of the semiconductor substrate and a vertical portion extending to a first depth below the frontside of the semiconductor substrate. A gate dielectric separates the lateral portion and the vertical portion from the semiconductor substrate. A backside trench isolation structure extends from a backside of the semiconductor substrate to a second depth below the frontside of the semiconductor substrate. The backside trench isolation structure laterally surrounds the photodetector, and the second depth is less than the first depth such that a lowermost portion of the vertical portion of the transfer transistor has a vertical overlap with an uppermost portion of the backside trench isolation structure.

In some embodiments, the present application provides a method. In the method, a plurality of photodetectors corresponding to a plurality of pixels, respectively, are formed in a semiconductor substrate. A doped region is formed to laterally surround and separate adjacent photodetectors from one another. Transfer gate electrodes are formed over corresponding pixels, wherein a transfer gate electrode includes a lateral portion extending over a frontside of the semiconductor substrate and a vertical portion extending to a first depth below the frontside of the semiconductor substrate. A backside trench structure is formed to extend into a backside of the semiconductor substrate, the backside trench structure is substantially aligned to and contacting the doped region and extending less than entirely through the semiconductor substrate. The backside trench structure is filled with dielectric to form a backside trench isolation structure, an uppermost portion of the backside trench isolation structure having a vertical overlap with a lowermost portion of the vertical portion of the transfer gate electrode.

In some embodiments, the present application further provides a device. The device includes a semiconductor substrate including a frontside and a backside. A doped region is disposed in the semiconductor substrate and laterally surrounds a pixel region of the semiconductor substrate. The doped region extends from the frontside of the semiconductor substrate to a first depth beneath the frontside of the semiconductor substrate. A transfer gate is disposed over the pixel region of the semiconductor substrate. The transfer gate has a lateral portion extending over the frontside of the semiconductor substrate and has a vertical portion extending to a second depth below the frontside of the semiconductor substrate. A gate dielectric separates the lateral portion and the vertical portion of the transfer gate from the semiconductor substrate. A photodetector is disposed in the pixel region and is disposed in the semiconductor substrate. The photodetector includes a collector region having a first doping type extending under the lateral portion of the transfer gate and disposed to a first side of the vertical portion of the transfer gate. A floating diffusion region is disposed in the pixel region and disposed in the semiconductor substrate. The floating diffusion region has the first doping type and is disposed to a second side of the vertical portion of the transfer gate. The floating diffusion region is spaced apart from the collector region by a channel region extending along the second side of the vertical portion of the transfer gate. A backside trench isolation structure extends from the backside of the semiconductor substrate to a third depth below the frontside of the semiconductor substrate. The backside trench isolation structure laterally surrounds the photodetector and the third depth is less than the first depth such that a lowermost portion of the vertical portion of the transfer gate has a vertical overlap with an uppermost portion of the backside trench isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a semiconductor substrate including a frontside and a backside;
a photodetector disposed in the semiconductor substrate;
a transfer gate disposed over the photodetector, the transfer gate having a lateral portion extending over the frontside of the semiconductor substrate and having a vertical portion extending from the lateral portion to a first depth below the frontside of the semiconductor substrate;
a gate dielectric separating the lateral portion and the vertical portion of the transfer gate from the semiconductor substrate; and
a backside trench isolation structure extending from the backside of the semiconductor substrate to a second depth below the frontside of the semiconductor substrate, the backside trench isolation structure laterally surrounding the photodetector and the transfer gate, and the second depth being less than the first depth such that an uppermost portion of the backside trench isolation structure has a vertical overlap with a lowermost portion of the vertical portion of the transfer gate,
wherein the gate dielectric extends directly over the uppermost portion of the backside trench isolation structure.

2. The device of claim 1, wherein a ratio of the first depth to the second depth ranges from approximately 1.05 to 2.

3. The device of claim 1, further comprising:
a doped region extending from the frontside of the semiconductor substrate to the second depth to contact the uppermost portion of the backside trench isolation structure.

4. The device of claim 1, wherein the gate dielectric continuously extends along the semiconductor substrate from directly between the lateral portion of the transfer gate and the semiconductor substrate to directly over the uppermost portion of the backside trench isolation structure.

5. The device of claim 3, wherein the gate dielectric extends directly over the doped region.

6. The device of claim 3, wherein the semiconductor substrate is directly between the gate dielectric and the uppermost portion of the backside trench isolation structure, and wherein the doped region is directly between the gate dielectric and the uppermost portion of the backside trench isolation structure.

7. The device of claim 3, wherein the backside trench isolation structure includes a vertical isolation segment having a first width about a central axis of the vertical isolation segment, and the doped region has a vertical doped segment with a second width about a central axis of the vertical doped segment, wherein the central axis of the vertical isolation segment is offset from the central axis of the vertical doped segment.

8. The device of claim 7, wherein the doped region has a bottommost surface that extends downward to a third depth below the frontside of the semiconductor substrate, the doped region extending past an uppermost surface of the backside trench isolation structure such that the third depth is slightly greater than the second depth, resulting in a step-like feature in a lower portion of the doped region.

9. The device of claim 1, wherein the backside trench isolation structure includes a dielectric material that directly contacts the semiconductor substrate.

10. A device, comprising:
a semiconductor substrate including a frontside and a backside;
a doped region disposed in the semiconductor substrate and laterally surrounding a pixel region of the semiconductor substrate, the doped region extending from the frontside of the semiconductor substrate to a first depth beneath the frontside of the semiconductor substrate;
a transfer gate disposed over the pixel region of the semiconductor substrate, the transfer gate having a lateral portion extending over the frontside of the semiconductor substrate and having a vertical portion extending to a second depth below the frontside of the semiconductor substrate, wherein a gate dielectric separates the lateral portion and the vertical portion of the transfer gate from the semiconductor substrate;

a photodetector disposed in the pixel region and disposed in the semiconductor substrate, the photodetector including a collector region having a first doping type extending under the lateral portion of the transfer gate and disposed to a first side of the vertical portion of the transfer gate;

a floating diffusion region disposed in the pixel region and disposed in the semiconductor substrate, the floating diffusion region having the first doping type and disposed to a second side of the vertical portion of the transfer gate, the floating diffusion region spaced apart from the collector region by a channel region extending along the second side of the vertical portion of the transfer gate; and a backside trench isolation structure extending from the backside of the semiconductor substrate to a third depth below the frontside of the semiconductor substrate, the backside trench isolation structure laterally surrounding the photodetector and the third depth being less than the second depth such that a lowermost portion of the vertical portion of the transfer gate has a vertical overlap with an uppermost portion of the backside trench isolation structure, wherein the backside trench isolation structure includes a vertical isolation segment having a topmost surface, and wherein both the doped region and the semiconductor substrate contact the topmost surface of the vertical isolation segment, wherein the vertical isolation segment has first sidewall and second sidewall, opposite the first sidewall, that meet the topmost surface of the vertical isolation segment on opposing sides of the topmost surface of the vertical isolation segment, and wherein the doped region is on an uppermost portion of the first sidewall of the vertical isolation segment and the semiconductor substrate is on an uppermost portion of the second sidewall of the vertical isolation segment.

11. The device of claim 10, wherein the vertical isolation segment has a first width about a central axis of the vertical isolation segment, and the doped region has a vertical doped segment with a second width about a central axis of the vertical doped segment, wherein the central axis of the vertical isolation segment is offset from the central axis of the vertical doped segment.

12. The device of claim 10, wherein the vertical isolation segment has an angled sidewall that extends from the topmost surface of the vertical isolation segment to the backside of the semiconductor substrate, and wherein the doped region is directly over the angled sidewall of the vertical isolation segment.

13. The device of claim 10, wherein a first sidewall of the doped region is directly over the topmost surface of the vertical isolation segment and a second sidewall of the doped region is laterally offset from the topmost surface of the vertical isolation segment.

14. A device, comprising:
a semiconductor substrate including a frontside and a backside;
a first photodetector disposed in the semiconductor substrate;

a first transfer gate disposed over the first photodetector, the first transfer gate having a lateral portion extending over the frontside of the semiconductor substrate and having a vertical portion extending from the lateral portion into the semiconductor substrate;

a backside trench isolation structure extending from the backside of the semiconductor substrate into the semiconductor substrate, wherein the backside trench isolation structure laterally surrounds the first photodetector and the first transfer gate, and wherein a bottommost surface of the first transfer gate is disposed below a topmost surface of the backside trench isolation structure such that an uppermost portion of the backside trench isolation structure has a vertical overlap with a lowermost portion of the vertical portion of the first transfer gate; and a doped region extending from the frontside of the semiconductor substrate into the semiconductor substrate to the topmost surface of the backside trench isolation structure, wherein a sidewall of the doped region is directly over the topmost surface of the backside trench isolation structure and the sidewall is laterally offset from opposing sidewalls of the backside trench isolation structure that meet the topmost surface of the backside trench isolation structure at opposing edges.

15. The device of claim 14, further comprising:
a gate dielectric separating the first transfer gate from the semiconductor substrate, wherein the bottommost surface of the first transfer gate is disposed vertically between the topmost surface of the backside trench isolation structure and a bottommost surface of the gate dielectric.

16. The device of claim 15, wherein the gate dielectric is directly over the topmost surface of the backside trench isolation structure, and wherein the semiconductor substrate is directly between the gate dielectric and the topmost surface of the backside trench isolation structure.

17. The device of claim 14, wherein a bottommost surface of the doped region is disposed vertically between the bottommost surface of the first transfer gate and the topmost surface of the backside trench isolation structure, resulting in a step-like feature in a lower portion of the doped region.

18. The device of claim 14, wherein the doped region is disposed on a sidewall of the backside trench isolation structure and on the topmost surface of the backside trench isolation structure, and wherein the semiconductor substrate is disposed on the topmost surface of the backside trench isolation structure.

19. The device of claim 14, wherein the vertical portion of the first transfer gate extends to a first depth below the frontside of the semiconductor substrate, and wherein the vertical overlap corresponds to a distance from the uppermost portion of the backside trench isolation structure to a lowermost portion of the vertical portion of the first transfer gate, the distance of the vertical overlap ranging from 5% to 50% of the first depth.

20. The device of claim 14, further comprising:
a second photodetector disposed in the semiconductor substrate; and
a second transfer gate disposed over the second photodetector, the second transfer gate having a lateral portion extending over the frontside of the semiconductor substrate and having a vertical portion extending from the lateral portion into the semiconductor substrate, wherein the backside trench isolation structure laterally surrounds the second photodetector and the second transfer gate, and wherein the backside trench isolation structure laterally separates the first transfer gate from the second transfer gate.

* * * * *